Dec. 13, 1966 J. R. FAHEY 3,291,578

METALLIZED SEMICONDUCTOR SUPPORT AND MOUNTING STRUCTURE

Filed Nov. 4, 1963

INVENTOR:
JAMES R. FAHEY,

BY Robert J. Mooney

HIS ATTORNEY.

United States Patent Office 3,291,578

Patented Dec. 13, 1966

3,291,578

METALLIZED SEMICONDUCTOR SUPPORT AND MOUNTING STRUCTURE

John R. Fahey, Syracuse, N.Y., assignor to General Electric Company, a corporation of New York Filed Nov. 4, 1963, Ser. No. 321,051
5 Claims. (Cl. 29—195)

This invention relates to improvements in semiconductor devices such as transistors. More particularly, the invention relates to an improved metallized ceramic support, and method of making the same, onto which molten noble metals such as gold or silver or alloys thereof will flow with uniformly intimate or wetting contact, and which is particularly suitable for the bonding of bodies of semiconductor material thereto. Further, the invention relates to an improved mounting structure for a pellet of semiconductor material embodying a ceramic substrate to which the semiconductor material is metallically bonded.

Because of the minute size and fragility of the bodies or pellets of active semiconductor material used in semiconductor devices such as transistors, it is often desirable in the manufacture of such devices to provide mechanical support for such pellets by mechanically fastening, as by brazing or otherwise intermetallically bonding, such pellets to a sturdy substrate of electrically non-conducting material such as an alumina ceramic plate. To form such a bond between the semiconductor pellet and the ceramic substrate requires that the ceramic substrate be first metallized or provided with a metallic coating securely bonded thereto, and then the seimconductor pellet is brazed or otherwise intermetallically bonded to the metallic coating on the ceramic substrate. One difficulty in such a mode of construction is that refractory metallic coating materials, such as molybdenum-manganese mixtures, which bond well to ceramic substrates having desired thermal coefficients of expansion matching the properties of the semiconductor pellet material, are not easily or thoroughly wettable by those brazing or intermetallic bonding metals such as gold and silver which are desirably compatible mechanically and electrically with semiconductor materials such as silicon and germanium. Accordingly, in the past, in order to secure a semiconductor pellet to the metallic coating on a supporting ceramic substrate with a metal brazing material of gold or silver, it has been necessary to provide between the metal brazing material and the metallic coating on the ceramic an intermediate or buffer layer of material such as copper or nickel, specially applied as by plating so as to suitably adhere to the ceramic metallizing coating and also provide a surface which will be suitably wetted by the gold or silver brazing metal. This type of construction, however, has the obvious disadvantage that it requires the additional layer of copper or nickel, with its attendant additional material and application costs, and, furthermore, the diffusion of the copper or nickel buffer material into the other materials present, including the semiconductor pellet, may undesirably contaminate or alter the electrical properties of the completed device.

The foregoing disadvantages of the prior art are overcome by the present invention which provides a readily wettable ceramic metallizing layer which is non-contaminating to semiconductor pellets bonded thereto and which is relatively inexpensive to form.

Accordingly, it is one object of the present invention to provide an improved semiconductor device construction wherein a semiconductor body is secured to a ceramic substrate by a metallic bond which is non-contaminating and which avoids the need for the metallizing buffer layer heretofore employed.

Another object is to provide an improved semiconductor device of the alumina ceramic substrate-supported type having more easily predeterminable electrical characteristics and reduced material costs.

Another object is to provide an improved ceramic substrate-supported semiconductor device of the foregoing character which is particularly suited to the use of a molybdenum-manganese metallizing coating on the ceramic substrate member.

Another object is to provide on a ceramic base member an improved metallizing layer easily wettable by noble metals such as gold and silver.

Another object of this invention is to provide a method of forming an easily wettable metallizing layer on a ceramic base member over which braze materials will flow freely for the bonding of seimconductor pellets to the base member.

Further objects and advantages of this invention will become apparent from the following description and the features of novelty will be pointed out with particularity in the claims annexed to and forming a part of this invention.

Briefly, the present invention is based on the discovery that noble metal brazing materials which are electrically and mechanically compatible with semiconductor materials such as silicon and germanium can be directly applied to a metallized ceramic with desired wettability if the metallizing coating of the ceramic includes a small amount of finely divided material from the class consisting of silicon or germanium or mixtures thereof. Further, in accordance with my invention, a paste of a metallizing mix containing powders of manganese and molybdenum and having dispersed therein fine particles of a material selected from the class consisting of silicon and germanium and mixtures thereof is applied in substantially uniform thickness on a ceramic base member and fired therewith to provide a tightly adherent metallizing layer on the ceramic base member. Subsequently, the fine particles are caused to stand out in relief on the surface of the metallizing layer by preferentially etching the metallizing layer to remove, or etch back, the other ingredients of the metallizing mix and thereby partially expose surface portions of the fine particles. Thereafter, braze materials which is melted in contact with the metallizing coating flows freely over and desirably wets and bonds to the fine particles and intervening surface portions of the metallizing coating, forming a continuous tightly adherent electrically conductive metallic layer to which a body of semiconductor can thereafter be easily securely bonded.

For a better understanding of this invention, reference may be had to the accompanying drawings in which.

Figure 1:
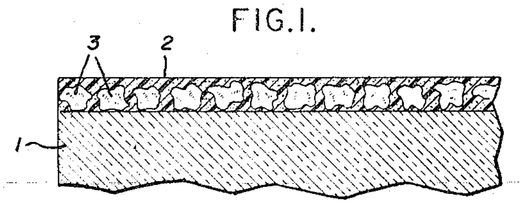
FIGURES 1–5 are sectional views of a portion of a semiconductor device constructed according to my invention, indicating various steps in the method of forming the easily wettable metallizing layer on a ceramic base member.

In FIGURE 1, there is shown a substrate or base member 1 of an alumina ceramic to which has been applied a substantially uniform thickness coating 2 comprising according to my invention a metallizing mix of manganese and molybdenum within which is dispersed fine particles 3 of silicon. The particles 3 may have a size, for example, such as to all pass through a mesh of 325 openings per inch. The coating 3 may, for example, have the following composition in percent by weight:

| | Percent |
|---|---|
| Molybdenum | 55 to 65 |
| Manganese | 25 to 35 |
| Silica | 6 to 8 |
| Silicon particles | 2 to 5 |

The manganese and molybdenum are chosen for the compatible thermal expansion properties which their mixture has relative to the ceramic base member 1 and for their ability to provide a tightly adherent metallizing layer on the ceramic base member 1. The silica may desirably serve as a fluxing medium to enhance the bond of the metallizing layer to the ceramic base member 1.

Figure 2:
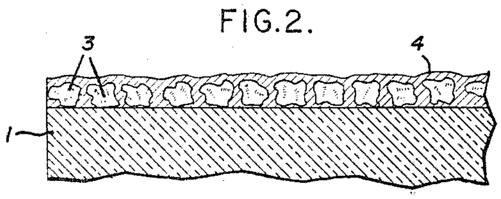

To facilitate applying the coating 2, the above metallizing mix with the silicon particles 3 dispersed therein may be mixed with a sufficient quantity of a suitable heat-removable organic binder, such as polyvinyl chloride or isobutylmethacrylate and butylcarbitolacetate, for easy spreading on the substrate 1. The coating 2 is then dried in air and fired with the ceramic base member 1 at a temperature of approximately 1350° centigrade for a period of approximately 45 minutes, the binder being thereby volatilized and driven off and the residual metallizing mix being tightly bonded to the ceramic base member 1. Thus, as shown in FIGURE 2, there is formed a tightly adherent metallizing layer 4 on the ceramic base member 1. During the firing, some of the fine particles 3 of silicon material may sinter but a substantial portion thereof remains in discrete particulate form dispersed throughout the metallizing layer 4.

Next, the layer 4 is etched to expose the silicon particles in partial relief. The preferential etching is performed in a sequence of two steps. First, the metallizing layer 4 is subjected to a nitric acid etch to remove surface portions of the molybdenum and manganese of the metallizing mix without attacking the silicon. Thereafter, a hydrofluoric acid etch is applied to the metallizing layer 4 to each back the silica ingredient and to clean the exposed portions of the fined particles 3 of silicon by removing any oxidized portions thereof whereby the surface of the exposed portions of the fine particles 3 constitute clean uncontaminated elemental silicon. The result is that the exposed portions of the fine particles 3 of silicon appear as outstanding portions or plateaus on the etched-back surface of the metallizing layer, as shown in FIGURE 3.

Figure 3:
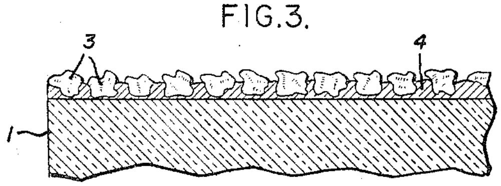
Figure 4:
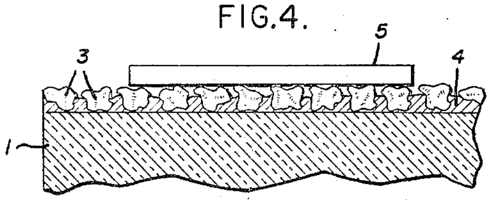
Figure 5:
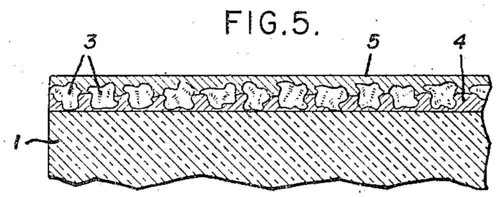

To complete the preparation of a supporting substrate for a body of semiconductor material in accordance with my invention, as shown in FIGURE 4 a coating of brazing material 5 is next applied to the structure shown in FIGURE 3. The brazing material may consist desirably of a noble metal or alloy or intermetallic compound of noble metals such as silver or gold. If desired, the brazing material may be doped with a donor (or acceptor as the case may be) impurity material so as to prevent the formation of an electrically rectifying contact with a body of N-type (or P-type as the case may be) semiconductor material subsequently to be secured to the exposed surface of the brazing material. For example, an antimony dopant may be included in the brazing material in anticipation of the attachment of an N-type body of semiconductor material thereto and an aluminum dopant may be employed in anticipation of attachment of a P-type body of semiconductor material. Conveniently, the brazing material may be applied by laying a preformed sheet or plate of brazing material on top of the outstanding particles 3 and again heating the assembly to a temperature such as about 1140° C. sufficient to melt the brazing material. Thereupon, according to my invention, as shown in FIGURE 5 the brazing material melts, flows across the outstanding particles 3 and spaces therebetween in uniformly intimate wetting contact therewith so as to form a eutectic therewith and, upon cooling to solidification, thereby forms a uniformly continuously adherent layer of brazing material superimposed thereon.

Figure 6:
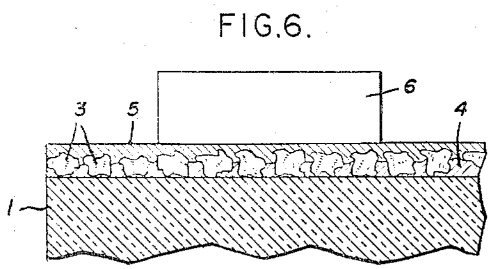
FIGURE 6 shows a completed semiconductor device including a semiconductor pellet mounted on the easily wettable metallizing layer of FIGURE 5.

Thereafter, a body of semiconductor material to be secured to and supported by the ceramic substrate 1 may be readily permanently bonded to the brazing material layer 5 by simply placing the semiconductor body 6 on layer 5 and heating the assemblage to the semiconductor-brazing material eutectic temperature so as to alloy the brazing material to the lower face of the semiconductor body, as shown in FIGURE 6.

The proportion of fine particles 3 of silicon has been indicated by way of example generally to be approximately 2 to 5% by weight of the metallizing mix. This range for the fine particles 3, whether of silicon or germanium or a mixture thereof, is preferable in that satisfactory wetting of braze materials to the surface of the metallizing layer 4 and tight adherence of the metallizing layer 4 to the ceramic base member 1 are both achieved. This range, however, is not critical and may well be found to vary for securing the best results when different bonding temperatures or different percentage compositions of the constituents of the metallizing mix are employed.

Various practical considerations establish the upper limit of the proportion of fine particles 3 in the metallizing mix. The first is that the proportion of fine particles 3 should not exceed a limit wherein the adherence of the metallizing layer 4 to the ceramic base member 1 is deleteriously affected. Second, if impurities are present in the material from which the fine particles 3 are formed, increasing the percentage of the fine particles 3 present in the metallizing mix concomitantly increases the amount of impurities present which may have poisoning effects on a semiconductor pellet mounted thereon. Also, the proportion of particles 3 should not be so excessive as to upset the bonding mechanism of the molybdenum-manganese-silica system to the ceramic, and should not be so excessive as to deleteriously affect the electrical continuity or mismatch the thermal expansion coefficient of the metallizing coating. Thus, the amount of particles 3 employed should be sufficient to provide, in accordance with the method of the invention, the easily wettable characteristic of the metallizing layer 4 but should not exceed a limit based on the foregoing consideration.

The material of the fine particles 3 is not dependent upon the material of the semiconductor pellet 6. The particles 3 may also be of germanium instead of silicon, or a mixture of particles of silicon and germanium may be employed within the contemplation of my invention. When the fine particles 3 are of germanium, the amount employed will be determined by considerations similar to those by which the range of silicon material was established. However, due to a somewhat greater susceptibility to attack by the acids of the preferential etch, care should be taken to avoid excessive destruction of the germanium particles 3.

As mentioned earlier, the silica of the metallizing mix performs a fluxing function in effecting the bond of the metallizing mix to the ceramic. The silica serves an additional function, however, in that it also aids in preventing poisoning of the semiconductor pellet by oxidizing the manganese and deterring diffusion of manganese into the pellet from the metallizing layer.

The present invention thus produces a metallizing layer on a ceramic base member having easily wettable characteristics permitting tightly adherent and contamination-free bonding of a semiconductor pellet to the ceramic base member. In addition, by eliminating the need of a separate intermediate buffer layer, such as the nickel-copper bonding layer of the prior art, the present invention provides a more nearly contamination-free mounting structure in which the mounted semiconductor pellet is not subject to the diffusion of poisoning dopants from such a metallic buffer layer.

Figure 7:
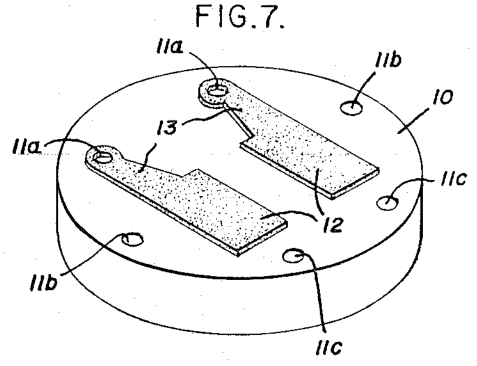
FIGURE 7, 8 and 9 are perspective views to indicate the practice of the invention in a specific adaptation for the mounting of semiconductor pellets on a ceramic base member.
Figure 8:
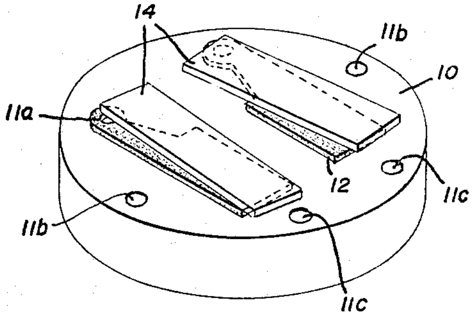
Figure 9:
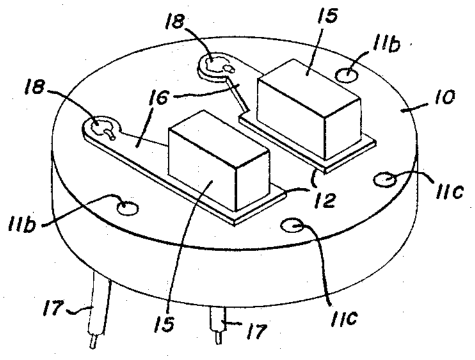

Due to the easy wettability of the metallizing layer 4 provided by the present invention, simplified techniques may be employed in mounting semiconductor pellets on ceramic base members, as shown in FIGURES 7, 8 and 9. As seen in FIGURE 7, a ceramic base member 10 is provided with a plurality of symmetrically located apertures 11*a*, 11*b*, and 11*c*. Metallizing layers 12 according to my invention and having predetermined configurations are formed on the ceramic base member 10. Illustratively, the configuration of the layers 12 in FIGURE 7 includes a portion 13 surrounding the apertures 11*a*.

Preformed members of brazing material 14 are disposed on the metallizing layers 12 as shown in FIGURE 7. Due to the superior wettability of the metallizing layers 12 of the invention, the brazing preforms 14 need not conform to the exact outlines of the metallizing layers 12 but rather may be of only approximately similar shape and may be positioned thereon in only approximately superposed relation. Upon heating of the assembled structure, the material of the brazing preforms 14 flows freely and evenly over the entire surface areas of the metallizing layers 12, while conforming to the boundaries thereof. Thereafter, as shown in FIGURE 9, bodies of semiconductor material 15 are readily bonded to the metallizing layers 12 of the ceramic base member 10 by brazing material layers 16.

In addition to providing tightly adherent bonding of the bodies 15 to the ceramic base member 10 for mechanical support, the braze layers 16 may connect electrically the adjacent region of each of the semiconductor bodies 15 with respectively associated electrical leads 17 which extend through the apertures 11*a* and are welded or soldered to the braze layers 16 as indicated at the positions 18. Other electrical conductors may extend through the apertures 11*b* and 11*c* for providing electrical connection to other regions of the semiconductor bodies 15.

It will thus be evident that my invention provides an improved metallizing coating which has superior wetting characteristics for noble metals bonded thereon, and which assures free flowing of braze materials thereover to thereby provide greater efficiency and reduced costs in the mounting of bodies of semiconductor material on supporting ceramic substrates. The invention thus provides an improved support structure for a semiconductor body which is not only mechanically sturdy but precludes contamination of the semiconductor pellet, thus assuring operational stability and long life of the semiconductor device.

Many modifications of the method and of the mounting structure developed in the practice of the method of this invention readily will be apparent to those skilled in the art. Thus, it is to be understood that the scope of my invention is not limited by the details of the foregoing description, but will be defined in the following claims.

What I claim as new and desire to secure by Letters Patent of the United States is:

1. In a mounting for a semiconductor pellet, a ceramic support, a molybdenum-manganese metallizing layer bonded to a surface of the ceramic support and including by weight about 55–65% molybdenum and 25–35% manganese, said metallizing layer having a bonding surface easily wettable by a noble metal brazing material and comprising outstanding portions consisting of fine particles selected from the class consisting of silicon, germanium, and mixtures thereof, said fine particles being dispersed throughout the bonding surface of said metallizing layer.

2. A semiconductor device comprising a ceramic support, a metallizing coating on at least a portion of one face of said ceramic support, said metallizing coating including a mixture of at least 55% by weight of at least one refractory metal ingredient, a silica ingredient, and an ingredient consisting of particulate material from the group consisting of silicon, germanium, and mixtures of silicon and germanium, said particulate material being embedded in and outstanding from the surface of said metallizing coating in partial relief, a layer of a noble metal brazing material of gold, silver or alloys thereof covering said metallizing coating and intermetallically bonded to the outstanding portions of said particulate material, and a body of semiconductor material intermetallically bonded to said layer of brazing material.

3. For use in supporting a semiconductor pellet intermetallically bonded thereto, a ceramic base member, a metallizing layer on said base member having a bonding surface easily wettable by an intermetallic bonding material, said metallizing layer including a metallizing mix of about 25–35 weight percent manganese, 55–65 weight percent molybdenum and silica and having dispersed therein fine particles of a material selected from the class consisting of silicon, germanium, and mixtures thereof, said fine particles ranging in amount from two to five percent by weight of the total weight of said metallizing mix, said easily wettable bonding surface having outstanding plateaus formed by portions of said fine particles.

4. A mounting structure for a semiconductor device including a ceramic base member, a metallizing layer formed in substantially uniform thickness on said ceramic base member and a semiconductor pellet bonded thereon by braze material interposed between said semiconductor pellet and said metallizing layer, wherein said metallizing layer comprises a metallizing mix of about 25–35 weight percent manganese, about 55–65 weight percent molybdenum and glass and has dispersed therein fine particles of a material selected from the class consisting of silicon, germanium, and mixtures thereof, and wherein said fine particles constitute from two to five percent of the total weight of said metallizing mix and said fine particles, and wherein said braze material is selected from the class consisting substantially of gold, silver, and alloys thereof, sad metallizing layer having an easily wettable bonding surface comprising plateaus of portions of said fine particles formed by preferentially etching back said metallizing mix to expose said portions of said fine particles at the surface of said metallizing layer.

5. A structure for mounting a semiconductor pellet comprising a ceramic base member, a layer of a metallizing mix on said base member, said metallizing mix comprising 55 to 65 percent by weight of molybdenum, 25 to 35 percent by weight of manganese, 6 to 8 percent by weight of silica, and 2 to 5 percent by weight of fine particles of a material selected from the class consisting of silicon, germanium and mixtures thereof, said particles having a size no larger than about 325 mesh.

References Cited by the Examiner

UNITED STATES PATENTS

| | | | |
|---|---|---|---|
| 2,228,878 | 1/1941 | Johnson | 29—155.5 |
| 2,497,090 | 2/1950 | Miller et al. | |
| 2,971,251 | 2/1961 | Willemse | 29—195 |
| 3,054,694 | 9/1962 | Aves | 29—195 X |
| 3,091,548 | 5/1963 | Dillon | 29—195 X |
| 3,113,846 | 12/1963 | Leschen | 29—195 |
| 3,197,290 | 7/1965 | Williams | 29—195 |
| 3,214,827 | 11/1965 | Phohofsky | 29—155.5 |

HYLAND BIZOT, *Primary Examiner.*